(12) United States Patent
Cheng et al.

(10) Patent No.: US 9,136,413 B2
(45) Date of Patent: Sep. 15, 2015

(54) PACKAGE STRUCTURE AND SOLAR CELL WITH THE SAME

(75) Inventors: Tsung-Dar Cheng, Taipei (TW); Jen-You Chu, Hsinchu (TW); Yi-Ping Chen, Kaohsiung (TW); Ping-Chen Chen, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 419 days.

(21) Appl. No.: 13/466,148

(22) Filed: May 8, 2012

(65) Prior Publication Data

US 2013/0153017 A1    Jun. 20, 2013

(30) Foreign Application Priority Data

Dec. 14, 2011  (TW) .............................. 100146217 A

(51) Int. Cl.
| | | |
|---|---|---|
| *H01L 31/02* | (2006.01) | |
| *H01L 31/0203* | (2014.01) | |
| *H01L 31/0232* | (2014.01) | |
| *H01L 31/0236* | (2006.01) | |
| *H01L 31/0256* | (2006.01) | |
| *H01L 31/04* | (2014.01) | |
| *H01L 31/042* | (2014.01) | |
| *H01L 31/048* | (2014.01) | |
| *H01L 31/054* | (2014.01) | |
| *H01L 31/18* | (2006.01) | |

(52) U.S. Cl.
CPC .......... *H01L 31/048* (2013.01); *H01L 31/0547* (2014.12); *Y02E 10/52* (2013.01)

(58) Field of Classification Search
CPC ...... G02B 6/0018; Y02E 10/50; Y02E 10/52; Y02E 10/547; Y02E 10/548; Y02E 10/541; H01L 31/048; H01L 31/022425; H01L 31/18; H01L 31/02008; H01L 31/0547; H01L 31/02167; H01L 31/02168; H01L 31/022466; H01L 31/0236; H01L 31/0203; H01L 31/0232; H01L 31/0322; H01L 31/0481; H01L 31/0237; H01L 31/02491; H01L 31/054
USPC .......................... 136/246, 256, 244, 251, 259
See application file for complete search history.

(56) References Cited

U.S. PATENT DOCUMENTS

| | | |
|---|---|---|
| 4,053,327 A | 10/1977 | Meulenberg, Jr. |
| 4,711,972 A | 12/1987 | O'Neill |

(Continued)

FOREIGN PATENT DOCUMENTS

| | | |
|---|---|---|
| CN | 101882635 | 11/2010 |
| TW | M366761 | 10/2009 |
| TW | 201041162 | 11/2010 |

OTHER PUBLICATIONS

Christine Eve Winiarz, "Measurement of Light Capture in Solar Cells from Silver- and Tin-Plated Patterned Bus Bars," Bachelor's thesis of the Massachusetts Institute of Technology, Jun. 2007.

(Continued)

*Primary Examiner* — Jayne Mershon
*Assistant Examiner* — Mayla Gonzalez Ramos
(74) *Attorney, Agent, or Firm* — Jianq Chyun IP Office

(57) ABSTRACT

A package structure and a solar cell with the same are provided. The package structure includes a transparent package bulk and at least one structure capable of changing a direction of light. The structure is disposed within the transparent package bulk and at a distance from a surface of the transparent package bulk. When applied to a solar cell, the package structure can reduce gridline shading.

13 Claims, 5 Drawing Sheets

(56) References Cited

U.S. PATENT DOCUMENTS

| | | | |
|---|---|---|---|
| 5,076,857 | A | 12/1991 | Nowlan |
| 5,110,370 | A | 5/1992 | Vogeli et al. |
| 5,228,926 | A | 7/1993 | Glatfelter et al. |
| 5,498,297 | A | 3/1996 | O'Neill et al. |
| 5,554,229 | A * | 9/1996 | Vogeli .................... 136/259 |
| 8,441,735 | B2 * | 5/2013 | Rodriguez-Parada et al. .................... 359/642 |
| 2007/0125415 | A1 | 6/2007 | Sachs |
| 2008/0006838 | A1 * | 1/2008 | Hattori et al. ............ 257/98 |
| 2010/0252094 | A1 | 10/2010 | Kim et al. |

OTHER PUBLICATIONS

Mingareev et al., "Diffractive optical elements utilized for efficiency enhancement of photovoltaic modules," Optics Express, Jun. 6, 2011, pp. 11397-11404, vol. 19, No. 12.

Jaus et al., "Light Management for Reduction of Bus Bar and Gridline Shadowing in Photovoltaic Modules," 35th IEEE Photovoltaic Specialists Conference, Jun. 2010, pp. 979-983.

"Office Action of Taiwan Counterpart Application", issued on Apr. 11, 2014, p. 1-p. 7.

"Office Action of China Counterpart Application", issued on Jan. 21, 2015, p. 1-p. 6.

\* cited by examiner

US 9,136,413 B2

PACKAGE STRUCTURE AND SOLAR CELL WITH THE SAME

CROSS-REFERENCE TO RELATED APPLICATION

This application claims the priority benefit of Taiwan application serial no. 100146217, filed on Dec. 14, 2011. The entirety of the above-mentioned patent application is hereby incorporated by reference herein and made a part of this specification.

TECHNICAL FIELD

The disclosure relates to a package structure capable of reducing gridline shading and a solar cell with the package structure.

BACKGROUND

Optical loss of a silicon solar cell is mainly incurred through three approaches. The first is surface reflection of a silicon wafer, and a current solution is to manufacture a rough structure and an antireflection film on the front side to reduce the reflectance. The second is reflection and absorption by the backside surface. The silicon is poor at absorbing long-wavelength light, so that long-wavelength light at the aluminium backside surface is absorbed and reflected.

The third is loss of incident light caused by gridline shading. The reason is as follows. Generally, in order to enable the silicon solar cell to effectively collect excited carriers to form a photocurrent, electrodes are screen printed on the front and reverse sides of a substrate by using silver paste and silver aluminium paste respectively, so as to collect the carriers. Interdigitated electrodes, which are screen printed by using the silver paste and employed by the front side, block the incident light from entering the solar cell. The light arriving at the electrodes is directly reflected back or absorbed by the electrodes, and only small part of the light can undergo total internal reflection by a package material due to large angles and enter the solar cell to be absorbed.

In order to reduce the area blocked by the electrodes, currently two methods are employed. The first is to change the shape and size of the electrodes. Although the blocked area can be effectively reduced by downsizing the shape and decreasing the size of the electrodes, the minimum line width capable of being printed by the current screen printing has to be taken into consideration. The second is to change the overall architecture of the cell, where electrodes on the front sides are connected to the reverse side to eliminate the gridline shading problem on the front side, for example, the Emitter Wrap-Through (EWT) solar cell, the Metallization Wrap-Through (MWT) solar cell, and the Interdigitated Back Contact (IBC) solar cell. However the solar cells of these kinds require complex manufacturing processes, thereby making mass production difficult.

In U.S. Pat. No. 4,711,972, U.S. Pat. No. 5,110,370 and U.S. Pat. No. 5,228,926, a light directing structure is manufactured on an interface between a package material and the air, so that by taking advantages of a difference between the index of refraction of the package material and that of the air, incident light, which used to directly enter the electrodes, arrives in unblocked areas by refraction, thereby increasing the amount of the incident light. However, the structure is on the interface between the package material and air, so that when the cell module is placed outdoors, dust and stains are incurred, and it is easy for the dust to deposit on the manufactured structure, thereby decreasing the overall flux of the incident light.

In addition, in U.S. Pat. No. 5,076,857 and U.S. Pat. No. 5,554,229, a light guiding structure is manufactured on a contact surface of the cell, so as to enable light to undergo total reflection. However, the design incurs the contact with the solar cell, so that the cell may be electrically affected.

SUMMARY

The disclosure provides a package structure with a microstructure capable of changing a travelling direction of light.

The disclosure provides a solar cell to reduce gridline shading.

A package structure is introduced herein. The package structure includes a transparent package bulk and at least one structure capable of changing a direction of light. The structure is disposed within the transparent package bulk and at a distance from a surface of the transparent package bulk.

A solar cell with the package structure is further introduced herein. Except for the package structure, the solar cell further includes a photoelectric conversion substrate, at least one lower electrode, and a plurality of upper electrodes. The lower electrode is disposed on a back side of the photoelectric conversion substrate, and the upper electrodes are disposed on a front side of the photoelectric conversion substrate respectively. The package structure covers the front side of the photoelectric conversion substrate and the upper electrodes. The structures capable of changing a direction of light, in the package structure, are disposed right over the upper electrodes respectively and at a predetermined distance from the upper electrodes.

Based on the above, in the disclosure, since the structure (for example, the reflective or diffusion structure) capable of changing a direction of light is disposed within the package structure, when the package structure is applied to a solar cell, light which used to be reflected or absorbed by the electrode in the solar cell is conducted by total reflection or a diffusion mechanism to the surface of the solar cell to be absorbed. Therefore, a photocurrent and efficiency of the solar cell may be increased.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
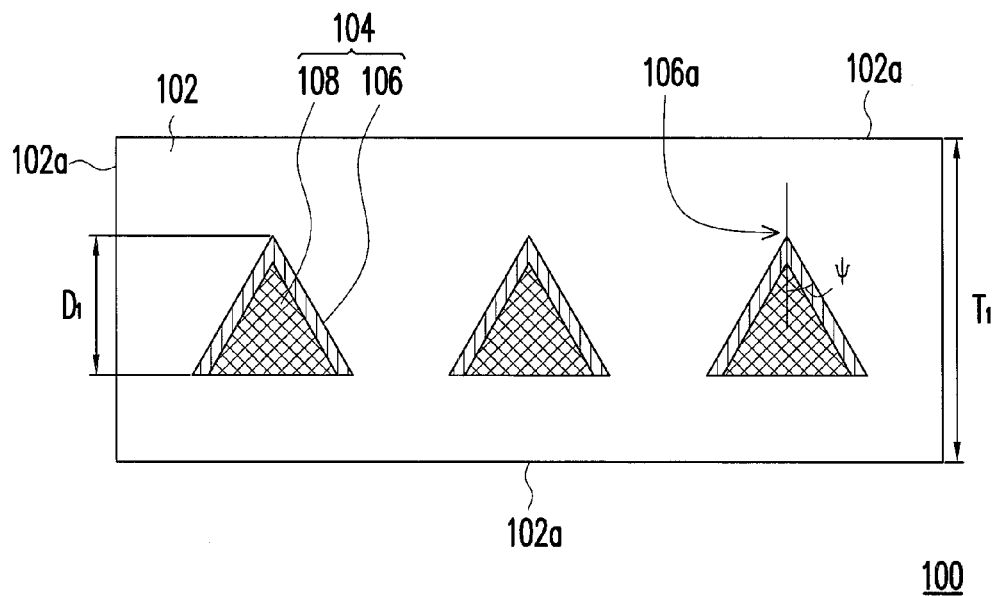
FIG. 1 is a schematic sectional view of a package structure according to a first embodiment of the disclosure.

FIG. 1 is a schematic sectional view of a package structure according to a first embodiment of the disclosure.

Referring to FIG. 1, a package structure 100 of the first embodiment includes a transparent package bulk 102 and at least one structure 104 capable of changing a direction of light. The structure 104 is disposed within the transparent package bulk 102 respectively and at a distance from a surface 102a of the transparent package bulk 102. In the embodiment, three structures 104 capable of changing a direction of light are shown. Each of the structures 104 capable of changing a direction of light includes a V-shaped reflective structure 106 and a filling material 108 filling the inside of the V-shaped reflective structure 106. A half angle ψ of a vertex angle 106a of the V-shaped reflective structure 106 satisfies 0<ψ≤60°. The height $D_1$ of the V-shaped reflective structure 106 is approximately greater than 50 µm, for example, 50 µm to 100 µm. The thickness $T_1$ of the package structure 100 is definitely greater than $D_1$.

In the first embodiment, the material of the V-shaped reflective structure 106 is, for example, a material selected from a group consisting of precious metals (ex. Au, Ag, Pt, etc.), transition metals (ex. Fe, Co, Ni, etc.), monetary metals (ex. Cu, Al, Cr, etc.) and alloys thereof. The filling material 108 is, for example, a material selected from a group consisting of precious metals (ex. Au, Ag, Pt, etc.), transition metals (ex. Fe, Co, Ni, etc.), monetary metals (ex. Cu, Al, Cr, etc.) and alloys thereof. Alternatively, the filling material 108 is, for example, a material selected from a group consisting of ethylene-vinyl acetate (EVA), silica resin, polystyrene (PS), poly methyl acrylate, methyl methacrylatestyrene copolymer, polycarbonate, polyethylene, silicone resin, calcium carbonate, silicon dioxide, titanium dioxide, and a compound thereof. Further, the materials of the filling material 108 and the transparent package bulk 102 may be the same or different materials. If the materials are the same, in the manufacturing process, the manufacturing may be performed by polymer lamination, so as to reduce steps of the manufacturing process. If the materials are different, filling may be performed by electroplating, so as to improve structural rigidity to prevent the following manufacturing process from affecting the structure and shape. The material of the transparent package bulk 102 is, for example, a material selected from a group consisting of EVA, silica resin, and a compound thereof.

Figure 2:
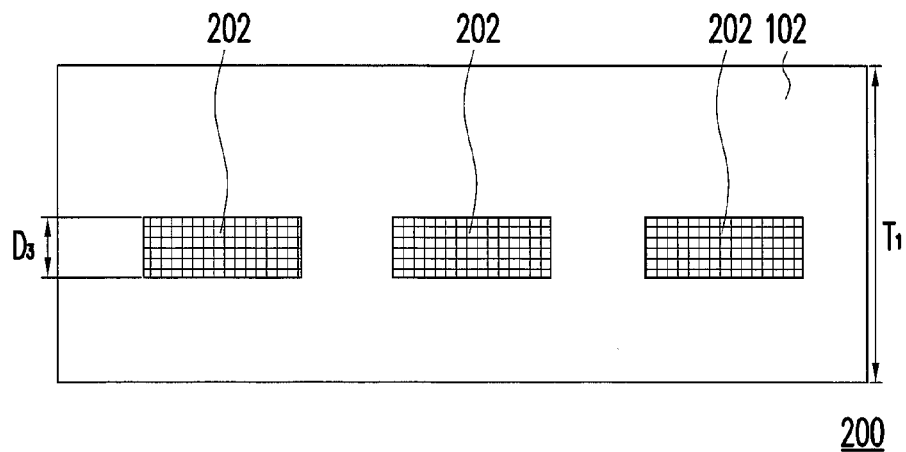
FIG. 2 is a schematic sectional view of a package structure according to a second embodiment of the disclosure.

FIG. 2 is a schematic sectional view of a package structure according to a second embodiment of the disclosure, in which element numerals being the same as those in the first embodiment are used to indicate the same members.

Referring to FIG. 2, a difference between the second embodiment and the above embodiment lies in that a structure capable of changing a direction of light in a package structure 200 is a light diffusion layer 202. The light diffusion layer 202 may be in the shape of a block as shown in FIG. 2; or be in the shape of a triangle, or a half disk. The material of the light diffusion layer 202 may include, for example, resin and diffusive particles. The shape of the diffusive particle may be spherical or irregular. The diffusive particle may be a particle being solid or porous. The particle size of the diffusive particle is approximately between 0.01 µm and 50 µm, for example.

The material of the diffusive particle is, for example, a material selected from a group consisting of polystyrene, poly methyl acrylate, methyl methacrylate-styrene copolymer, polycarbonate, polyethylene, silicone resin, calcium carbonate, silicon dioxide, titanium dioxide, and a compound thereof. A ratio of the diffusive particles to the resin is approximately 1/99 to 99/1, and preferably 1/6 to 3/1, for example. The thickness $D_3$ of the light diffusion layer is only required to be substantially smaller than the thickness $T_1$ of the package structure, and has no other special limits.

The material of the light diffusion layer 202 may further include an additive, for example, at least one of non-ionic dispersing agent and surfactant. The non-ionic dispersing agent is, for example, a dispersing agent including a structure of fluoroaliphatic polymeric esters, and a ratio of the amount of the added non-ionic dispersing agent to the total amount of the diffusive particles is approximately 0.005% to 15%.

Figure 3:
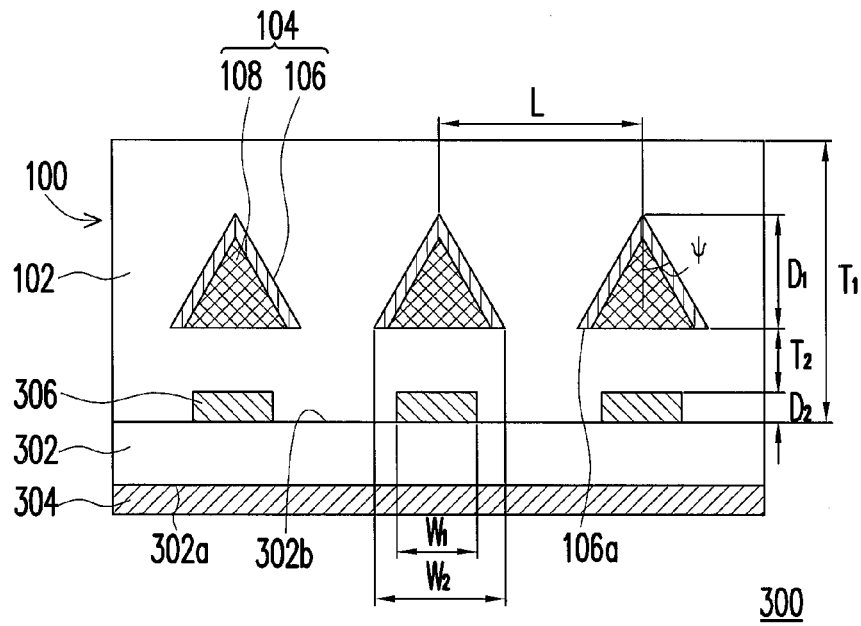
FIG. 3 is a schematic sectional view of a solar cell according to a third embodiment of the disclosure.

FIG. 3 is a schematic sectional view of a solar cell according to a third embodiment of the disclosure, in which element numerals being the same as those in the first embodiment are used to indicate the same members.

Referring to FIG. 3, a solar cell 300 of the third embodiment includes the package structure 100 of the first embodiment. The solar cell 300 further includes a photoelectric conversion substrate 302, at least one lower electrode 304, and a plurality of upper electrodes 306. The lower electrode 304 is disposed on a back side 302a of the photoelectric conversion substrate 302, and the upper electrodes 306 are disposed on a front side 302b of the photoelectric conversion substrate 302 respectively. The package structure 100 covers the front side 302b of the photoelectric conversion substrate 302 and the upper electrodes 306. The structures 104 capable of changing a direction of light, in the package structure 102, are disposed right above the upper electrodes 306 respectively and at a predetermined distance $T_2$ from the upper electrodes 306.

When the structure 104 capable of changing a direction of light includes the V-shaped reflective structure 106, the predetermined distance $T_2$ is approximately smaller than a result of the following expression:

$$\frac{L-\frac{W_1}{2}}{\tan 2\psi} - D_1 - D_2,$$

where $D_1$ is the height of the V-shaped reflective structure 106, $D_2$ is the thickness of each upper electrode 306, L is a pitch of each upper electrode 306, $W_1$ is the width of each upper electrode 306, and ψ is a half angle ψ of a vertex angle of the V-shaped reflective structure 106 and satisfies 0<ψ≤60°.

In the embodiment, the width $W_2$ of a bottom edge 106a of the V-shaped reflective structure 106 is at least equal to the width $W_1$ of each upper electrode 306. As shown in FIG. 3, $W_2$ is greater than $W_1$. The thickness $T_1$ of the package structure 100 is at least greater than the sum of the predetermined distance $T_2$, the height $D_1$ of the V-shaped reflective structure and the thickness $D_2$ of each upper electrode.

The material of the photoelectric conversion substrate 302 is, for example, a material selected from a group consisting of monocrystalline silicon, polycrystalline silicon, amorphous silicon, CdTe, copper indium selenide (CIS), copper indium gallium selenide (CIGS), Ge, a group III-V aluminium indium gallium arsenide semiconductor combination, a polymer solar cell active layer material, and combinations thereof. The material of the lower electrode 304 is, for example, a material selected from a group consisting of Au, Ag, Cu, Al, and alloys thereof; or FTO, ITO, IZO, NiO, or a conductive paste. The material of the upper electrode 306 is, for example, a material selected from a group consisting of Au, Ag, Cu, Al, and alloys thereof; or FTO, ITO, IZO, NiO, or a conductive paste.

Figure 4:
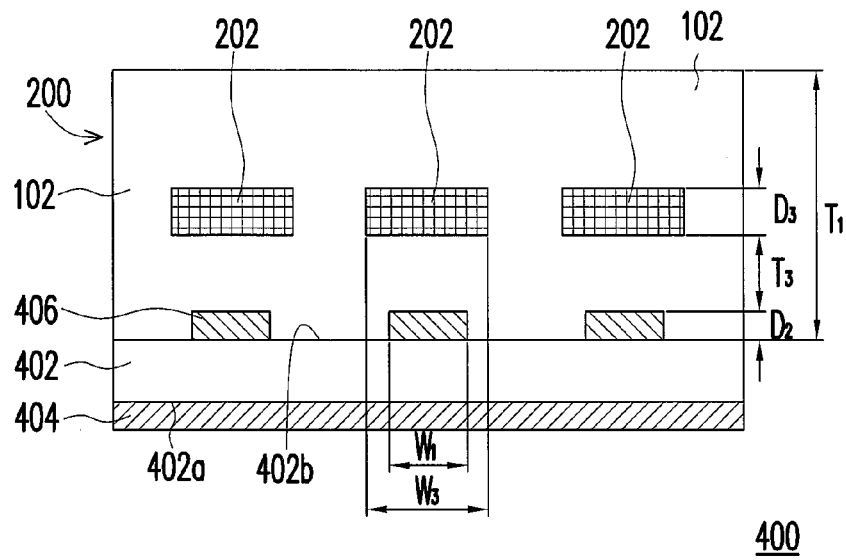
FIG. 4 is a schematic sectional view of a solar cell according to a fourth embodiment of the disclosure.

FIG. 4 is a schematic sectional view of a solar cell according to a fourth embodiment of the disclosure, in which element numerals being the same as those in the second embodiment are used to indicate the same members.

Referring to FIG. 4, a solar cell 400 of the fourth embodiment includes the package structure 200 of the second embodiment. The solar cell 300 further includes a photoelectric conversion substrate 402, at least one lower electrode 404, and a plurality of upper electrodes 406. The lower electrode 404 is disposed on a back side 402a of the photoelectric conversion substrate 402, and the upper electrodes 406 are disposed on a front side 402b of the photoelectric conversion substrate 402 respectively. The package structure 100 covers the front side 402b of the photoelectric conversion substrate 402 and the upper electrodes 406. The light diffusion layer 202 in the package structure 200 is disposed right above each upper electrode 406 and at a predetermined distance $T_3$ from the upper electrodes 406. A range of $T_3$ is, for example, defined as $0<T_3<(T_1-D_2-D_3)$, where $D_3$ is the height of the light diffusion layer 202.

In the fourth embodiment, the width $W_3$ of the light diffusion layer 202 is required to be at least equal to the width $W_1$ of each upper electrode 406, or as shown in FIG. 4, greater than the width $W_1$. The thickness $T_1$ of the package structure 200 is at least greater than the sum of the predetermined distance $T_3$, and the height $D_3$ of the light diffusion layer 202 and the thickness $D_2$ of each upper electrode. In the fourth embodiment, the third embodiment may serve as a reference for the materials of the photoelectric conversion substrate 402, the lower electrode 404 and the upper electrode 406.

A plurality of experimental results is provided below to verify the effect of the embodiments.

Experimental Example 1

Figure 5:
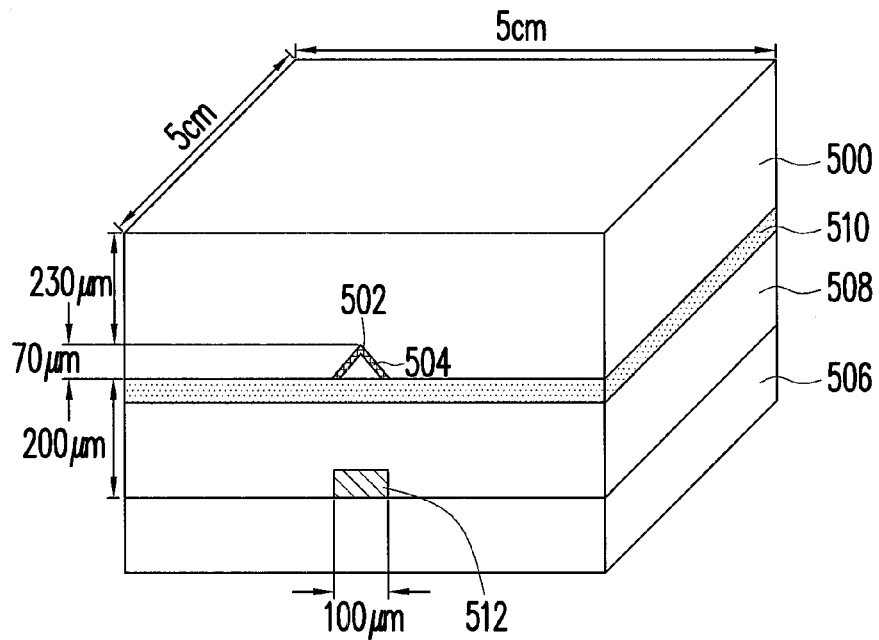
FIG. 5 is a schematic three-dimensional view of a structure of an experimental example 1.

FIG. 5 is a schematic view of an experimental example 1. The structure includes a package material EVA film 500. A V-shaped groove 502 is manufactured on the package material 500. A V-shaped reflective structure 504 is coated on the inside of the groove 502 to induce light total reflection. A surface of a solar cell 506 is encapsulated by using another EVA film 508, and an optical liquid with the index of refraction being 1.5 is used for filling therebetween, so that when consequential experiment of a control group is performed, measurement can be performed on the same solar cell 506, and it can prevent from interface reflection between the EVA films 500 and 508. Verification of a gain effect of the package structure with the structure capable of changing a direction of light and the solar cell is described below.

The V-shaped groove 502 is manufactured by hot embossing since the package material has the fluidity feature at high temperature. In order to make the size of a mold precisely, the mold may be manufactured by anisotropically etching silicon wafer. Generally the width of an interdigitated electrode 512 of the solar cell is about 100 μm, and thus a plurality of patterns each with a width of 100 μm and a length of 6.5 cm in a photoresist is formed by using a photolithography process with a photomask on a silicon wafer coated with SiNx.

After the photoresist is developed, SiNx at the patterns is removed by reactive ion etching. Then, the wafer is put into a 30 wt % KOH solution for etching so as to form a plurality of openings. The temperature of the etching is 75° C., and the duration of the etching is 6 hours. Finally, SiNx on the surface is removed, and a nickel mold with a plurality of V-shaped structures is formed by electroforming the etched wafer. A surface profiler is employed to scan the V-shaped structures of the nickel mold, so as to obtain the bottom width, 106 μm, and the height, 70 μm, of each of the V-shaped structures.

In order to facilitate mold releasing during the hot embossing, the surface of the mold is coated with a layer of fluoroalkylsilane (FAS) and then the EVA and the mold are placed in a hot press. Vacuum pumping is performed for 3 minutes, and then the hot embossing is performed for 5 minutes at 100° C. and 150 psi. Thereafter, the pressure is released and the temperature returns to 40° C., thereby completing imprinting. The resulting film is coated with a reflective silver layer of 200 nm by using sputtering with a mask, thereby forming the EVA film 500 with the V-shaped reflective structure 504. The thickness of the EVA film 500 is 300 μm. The V-shaped reflective structure 504 has a width of 106 μm and a height of 70 μm.

In order to measure the effect of FIG. 5, a 5 cm×5 cm monocrystalline silicon solar cell 506 is encapsulated with a 200 μm-thick EVA film 508 by hot embossing, and the electrode 512 is connected outward by ribbons.

Control Group

In an example for comparison, the EVA film without the V-shaped reflective structure is attached, by using the optical liquid (512 of FIG. 5) with the index of refraction being 1.5, to the solar cell (506 of FIG. 5) encapsulated with the EVA, so as to avoid interface reflection.

Simulation

Figure 6:
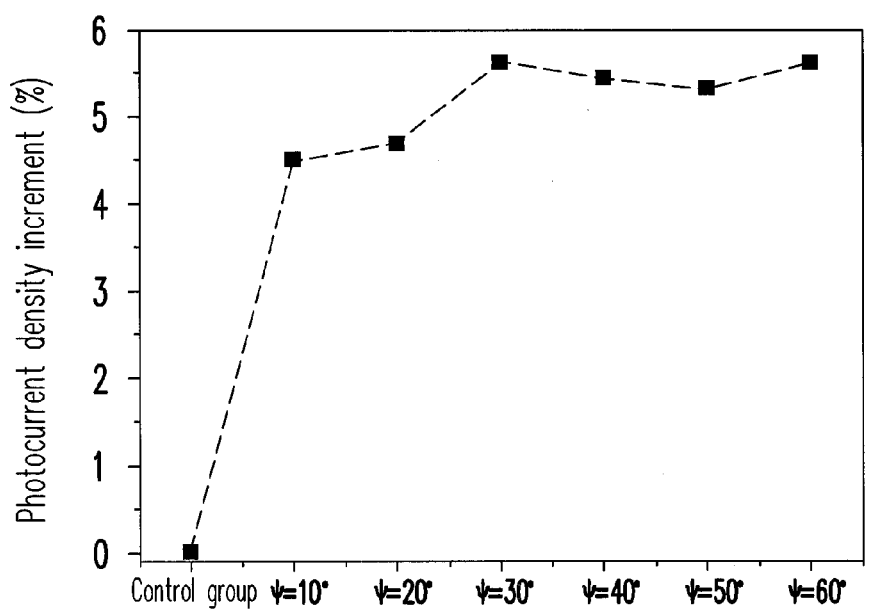
FIG. 6 is a simulation curve diagram of photocurrent density increments of the structure of FIG. 5 and a control group.

FIG. 6 is a simulation result of the structure of FIG. 5 and the control group, where ψ is the value of the half angle of the V-shaped reflective structure 504, and the control group on the horizontal axis indicates that no structure exists in the middle of the EVA film 500. It can be seen from the simulation result that, with the incident angle being 0° and with the wavelength being between 400 nm and 1,000 nm, when ψ is between 10° and 60°, the photocurrent density can always be increased, and especially when ψ is between 30° and 40°, a rise of 5.5% can be achieved. In the experimental example 1, ψ is 37.1° which meets the optimal condition in the simulation.

Measurement

Figure 7:
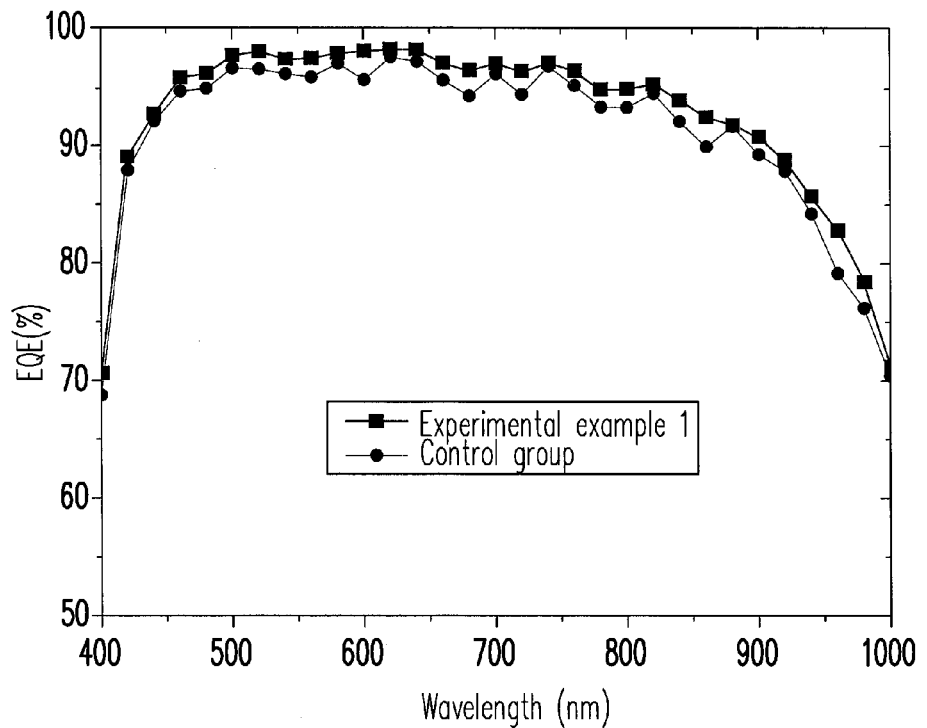
FIG. 7 is a measurement curve diagram of external quantum efficiency (EQE) of the structure of FIG. 5 and a control group.

For the experimental example 1 and the control group, EQE is measured respectively, and variations of the photocurrent and the efficiency thereof are measured by using a AM1.5G solar simulator. FIG. 7 is a measurement result of the EQE. The reflectance of silver is very high in the solar spectrum, and the manufactured V-shaped reflective structure can always improve the EQE within the wavelength from 400 nm to 1,000 nm. The solar simulator measurement result is shown in Table 1. The solar cell with the V-shaped reflective structure achieves an increment of 1.3% in the photocurrent and an increment of 1.8% in the efficiency compared with the solar cell without the structure.

TABLE 1

|  | Isc [mA] | Voc [V] | FF | η[%] |
| --- | --- | --- | --- | --- |
| Control group | 852 | 0.618 | 0.715 | 15.0 |
| Experimental example 1 | 863 | 0.619 | 0.715 | 15.3 |
| Gain (%) | 1.3 | 0.16 | 0 | 1.8 |

Experimental Example 2

Figure 8:
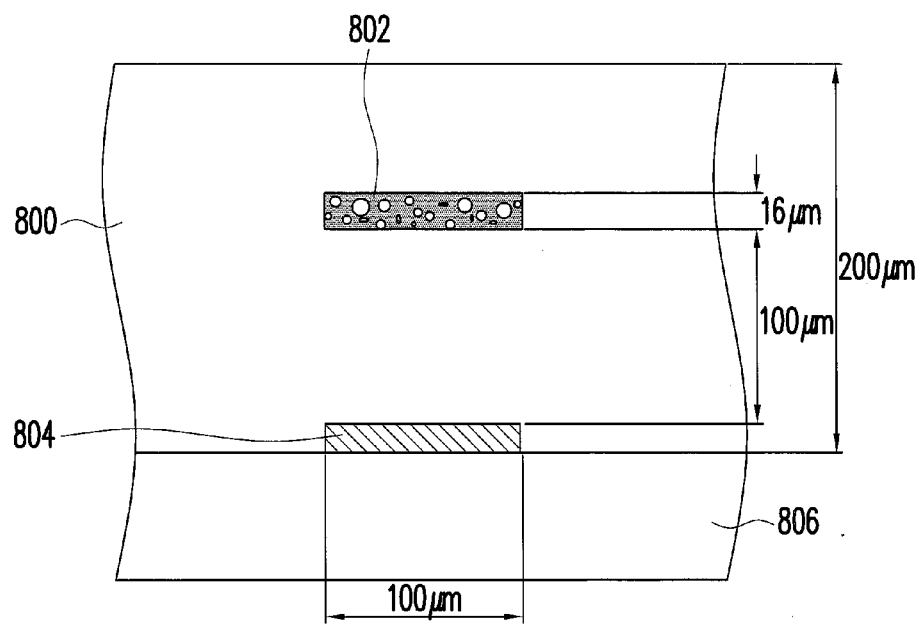
FIG. 8 is a schematic sectional view of a structure of an experimental example 2.

FIG. 8 is a schematic structural view of a transparent package bulk 800 in which a light diffusion layer 802 is added. A position where the light diffusion layer 802 is corresponds to the position of an electrode 804. In the structure, for the transparent package bulk 800, the material is EVA, and the thickness is set to 200 μm. For the light diffusion layer 802, the material is acrylic resin with index of refraction being 1.48, and the thickness is set to 16 μm. For the light diffusion layer 802, the material is PS with index of refraction being 1.59, and employed diffusive particles have the average particle size of 6 μm and the shape being solid and spherical. The resin and the diffusive particles are mixed according to a weight ratio of 1:0.83, so as to manufacture the diffusion layer with the thickness of 15-18 μm. The total transmission (TT) is 89.61%, the haze (Hz) is 97.65%, and the diffusivity (Df) is 28.1%.

Figure 9:
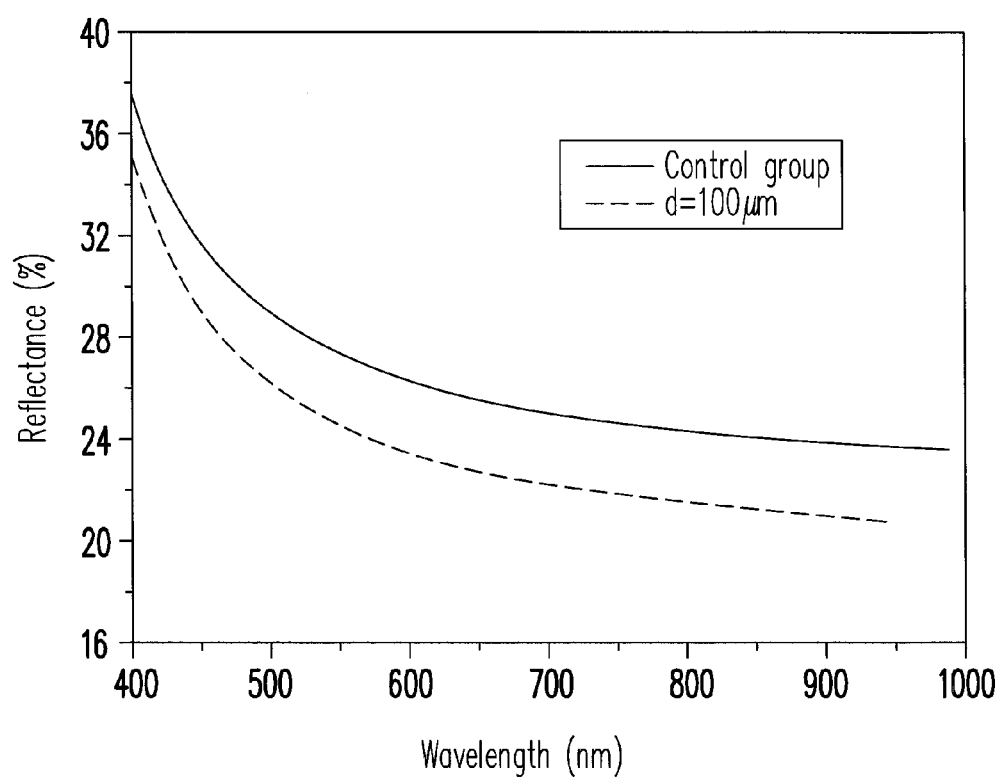
FIG. 9 is a simulation curve diagram of reflectance of the structure of FIG. 8 and a control group.

Ray-tracing software is used for simulation to achieve a result when a distance d between the light diffusion layer 802 and the electrode 804 is 100 μm, as shown in FIG. 9. After the light diffusion layer 802 is added, in addition to that part of the incident light which used to be blocked by the electrode 804 is conducted to the solar cell 806 by diffusion, the light diffusively reflected by the electrode 804 re-enters the light diffusion layer 802, and then re-enters the solar cell 806 by diffusion, thereby decreasing the overall reflectance. After the light diffusion layer 802 is added, the overall simulated photocurrent density is increased by 3.8% compared with that without the light diffusion layer 802, which demonstrates that the light diffusion layer 802 decreases the reflectance, thereby improving the efficiency of the cell.

In view of the above, the architecture and the manufacture process of the present solar cell remain unchanged, but the efficiency of the solar cell may improve since the structure disposed in the package material conducts the light irradiated on the electrodes to the solar cell not blocked by the electrodes by reflection or diffusion. Furthermore, the structure disposed within the package material does not change the topology of the interface between the package material and air, and consequently, as original solar cell package architecture, the package material and the solar cell are attached by the same material. Therefore, dust can be prevented from depositing at the interface between the package structure and air, it can keep a surface state between the package structure and the solar cell is the same as that in the original architecture, and no electrically difference is incurred.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A package structure, comprising:
   a transparent package bulk; and
   at least one structure capable of changing a direction of light, disposed within the transparent package bulk and at a first distance from a surface of the transparent package bulk, wherein the at least one structure capable of changing a direction of light comprises:
   a V-shaped reflective structure; and
   a filling material, filling the inside of the V-shaped reflective structure, wherein materials of the filling material and the transparent package bulk are the same.

2. The package structure according to claim 1, wherein a half angle $\psi$ of a vertex angle of the V-shaped reflective structure satisfies $0<\psi\leq60°$.

3. The package structure according to claim 1, wherein a height of the V-shaped reflective structure is greater than 50 μm.

4. The package structure according to claim 1, wherein a material of the V-shaped reflective structure is one selected from a group consisting of precious metals, transition metals, monetary metals, and alloys thereof.

5. The package structure according to claim 1, wherein the materials of the filling material and the transparent package bulk are selected from a group consisting of ethylene-vinyl acetate, silica resin, and a compound thereof.

6. A solar cell, comprising the package structure according to claim 1, wherein the solar cell further comprises:
   a photoelectric conversion substrate;
   at least one lower electrode, disposed on a back side of the photoelectric conversion substrate; and
   a plurality of upper electrodes, disposed on a front side of the photoelectric conversion substrate, wherein
   the package structure covers the front side of the photoelectric conversion substrate and the upper electrodes, and the at least one structure capable of changing a direction of light, in the package structure, is disposed right above each of upper electrodes and at a second distance from the upper electrodes.

7. The solar cell according to claim 6, wherein the second distance is smaller than $$\frac{L-\frac{W_1}{2}}{\tan 2\psi} - D_1 - D_2,$$

wherein $D_1$ is a height of the V-shaped reflective structure, $D_2$ is a thickness of each of the upper electrodes, L is a pitch of each of the upper electrodes, $W_1$ is the width of each of the upper electrodes, and $\psi$ is a half angle of a vertex angle of the V-shaped reflective structure.

8. The solar cell according to claim 7, wherein the half angle $\psi$ of the vertex angle of the V-shaped reflective structure satisfies $0<\psi\leq60°$.

9. The solar cell according to claim 7, wherein the width of a bottom edge of the V-shaped reflective structure is at least equal to the width of each upper electrode.

10. The solar cell according to claim 7, wherein a thickness of the package structure is at least greater than the sum of the second distance, the height of the V-shaped reflective structure and the thickness of each upper electrode.

11. The solar cell according to claim 6, wherein a material of the photoelectric conversion substrate is one selected from a group consisting of monocrystalline silicon, polycrystalline silicon, amorphous silicon, CdTe, copper indium selenide (CIS), copper indium gallium selenide (CIGS), Ge, a group III-V aluminium indium gallium arsenide semiconductor combination, a polymer solar cell active layer material, and combinations thereof.

12. The solar cell according to claim 6, wherein a material of the lower electrode is one selected from a group consisting of Au, Ag, Cu, Al, and alloys thereof; or FTO, ITO, IZO, NiO, or a conductive paste.

13. The solar cell according to claim 6, wherein a material of the upper electrodes is one selected from a group consisting of Au, Ag, Cu, Al, and alloys thereof; or FTO, ITO, IZO, NiO, or a conductive paste.

* * * * *